United States Patent
Oliver

(10) Patent No.: US 6,294,473 B1
(45) Date of Patent: Sep. 25, 2001

(54) METHOD OF POLISHING SUBSTRATES COMPRISING SILICON DIOXIDE AND COMPOSITION RELATING THERETO

(75) Inventor: Michael R. Oliver, Portland, OR (US)

(73) Assignee: Rodel Holdings Inc., Wilmington, DE (US)

(*) Notice: Subject to any disclaimer, the term of this patent is extended or adjusted under 35 U.S.C. 154(b) by 0 days.

(21) Appl. No.: 09/325,304

(22) Filed: Jun. 3, 1999

Related U.S. Application Data

(60) Provisional application No. 60/087,868, filed on Jun. 3, 1998.

(51) Int. Cl.$^7$ .................................................. H01L 21/461
(52) U.S. Cl. .................... 438/705; 438/692; 438/424; 438/435; 438/437
(58) Field of Search .................... 438/424, 435, 438/437, 795, 692, 705

(56) References Cited

U.S. PATENT DOCUMENTS 5,576,247 * 11/1996 Yano et al. ........................... 437/225
5,626,924 * 5/1997 Ishikawa ............................. 427/579
5,855,804 * 1/1999 Walker ................................ 216/89
5,950,101 * 9/1999 Yano et al. ......................... 438/618

OTHER PUBLICATIONS

"Chemical Etch Rate of Plasma–Enhanced Chemical Vapor Deposited SiO2 Films", Besser and Louris, J. Electrochem. Soc., vol. 144, No. 8, Aug. 1997.

"The Use of Hydrophobic AEROSIL® in the Coatings Industry", Technical Bulletin Pigments, Degussa, Frankfurt, Germany, 4$^{th}$ edition, May 1993.

* cited by examiner

Primary Examiner—Trung Dang
(74) Attorney, Agent, or Firm—Kenneth A. Benson; Gerald K. Kita; Konrad Kaeding

(57) ABSTRACT

A method of manufacturing semiconductor devices or precursors to semiconductor devices by hydrophobically modifying a device layer to thereby decrease the rate of polishing of the layer by at least 15%. The hydrophobically modified layer can be used as a stop layer to thereby allow for improved planarization of at least one layer of the device.

6 Claims, 5 Drawing Sheets

मेथड OF POLISHING SUBSTRATES COMPRISING SILICON DIOXIDE AND COMPOSITION RELATING THERETO

This application claims the benefit of U.S. Provisional Application No. 60/087,868 filed Jun. 3, 1998.

FIELD OF THE INVENTION

The present invention relates generally to the polishing of substrates and is particularly advantageous in the manufacture of semiconductor devices or the like. More specifically, the present invention is directed to a semiconductor device (or a precursor to a semiconductor device) layer comprising modified silicon dioxide, whereby the layer polishes at a much lower removal rate than unmodified silicon dioxide.

DISCUSSION OF THE PRIOR ART

During semiconductor device manufacture, one or more layers comprising silicon dioxide are polished or planarized, typically by a chemical-mechanical polishing ("CMP") process. This process will hereafter be referred to as "oxide CMP."

Oxide CMP has been problematic. Whereas other CMP processes tend to begin with one material and then stop at the interface to a second material, oxide CMP is a "blind" process, because it generally begins and ends with silicon dioxide at the surface. Generally speaking, no obvious interface is ever reached to indicate an end point.

As a result, oxide CMP is often conducted for a predetermined amount of time, and the surface profile is then measured. If the oxide layer has not been sufficiently thinned and/or the desired degree of planarity has not been obtained, then the silicon dioxide substrate must be re-polished. If the substrate is too thin, then the semiconductor device must be reworked or scrapped. Such a process can be expensive and inefficient.

In shallow trench isolation ("STI"), silicon nitride is typically used as a stop layer and as a means to provide end point detection. For other semiconductor device manufacturing steps involving a silicon dioxide containing substrate (other than STI), a silicon nitride layer is very difficult, typically impossible, to be successfully integrated into the total semiconductor process.

A need therefore exists to provide an oxide CMP process capable of efficiently and effectively indicating when a desired amount of silicon dioxide has been removed and/or when a desired degree of planarization has been obtained.

SUMMARY OF THE INVENTION

The present invention is directed to a method for polishing a silicon dioxide substrate during the manufacture of a semiconductor device or semiconductor device precursor. The method includes the step of hydrophobically modifying a substrate comprising silicon dioxide.

In a preferred embodiment, the oxide CMP processes of the present invention comprise at least the following steps. First, a base layer comprising silicon dioxide is created on a semiconductor device (or a semiconductor device precursor). The silicon dioxide can be deposited in a hydrophobic state, such as by altering the mix of the source gases that feed a CVD (chemical vapor deposit) reactor. In one embodiment, the feed gases are modified to decrease the amount of oxygen radical available for CVD (such as by replacing at least a portion of the $O_2$ with $N_2O$), thereby increasing (at least at the surface) the ratio of hydrophobic moieties (such as siloxane moieties) to hydrophilic moieties, (such as silanol moieties), relative to conventional CVD of silicon dioxide.

Alternatively, conventional hydrophilic silicon dioxide can be deposited by conventional means, such as by CVD, and the surface of the silicon dioxide can later be hydrophobically modified. In either event, the silicon dioxide, at least at the surface, is hydrophobically modified, thereby causing a surface layer of the silicon dioxide to be less hydrophilic (the modified silicon dioxide is sufficiently less hydrophilic to decrease the average rate of polishing by at least 10%, more preferably by at least 25%, yet more preferably by at least 50% and yet more preferably up to 100%, relative to the average rate of polishing of conventional, hydrophilic silicon dioxide).

Hydrophobicity can be quantified according to the contact angle of a drop of water on the surface of a substrate (See, FIG. 6). For the silicon dioxide substrates of the present invention, hydrophobic modification preferably increases the contact angle by at least 5 degrees, more preferably at least 10 degrees and yet more preferably at least 25 degrees. Conventional (hydrophilic) silicon dioxide provides a contact angle of less than about 80 degrees. Preferred hydrophobically modified silicon dioxide of the present invention provide a contact angle of greater than 90 degrees.

In a second step, a top layer, preferably comprising silicon dioxide, is created over the layer comprising hydrophobically modified silicon dioxide, whereby the layer comprising modified silicon dioxide is bonded between the top layer and the base layer. In a third step, the top layer is then polished until at least a portion of the layer comprising modified silicon dioxide is exposed to the polishing interface (the layer comprising modified silicon dioxide acts as a "stop layer" or an "endpoint detection" layer).

Optionally, the exposed portion of the layer comprising modified silicon dioxide is thereafter chemically treated to thereby increase the modified silicon dioxide layer's hydrophobicity, preferably to its original unmodified state.

The hydrophobically modified silicon dioxide of the present invention can be used as a stop layer or an end-point detection layer and can be used as a substitute for conventional stop layers or end-point detection layers otherwise used in silicon dioxide polishing. The hydrophobically modified silicon dioxide of the present invention also provides the option of a stop layer or end-point detection layer where none was previously possible, due to manufacturing constraints.

The hydrophobically modified silicon dioxide of the present invention is particularly advantageous where the hydrophobic modification can be reversed, thereby allowing the stop layer or end-point detection layer to be activated and/or inactivated, as desired. Furthermore, the hydrophobically modified silicon dioxide of the present invention can be advantageous relative to many conventional stop layers or end-point detection layers, because the present invention does not require the introduction of a completely new layer, such as silicon nitride, the presence of which can be more problematic than a hydrophobically modified silicon dioxide. The hydrophobically modified silicon dioxide of the present invention removes many of the constraints and much of the complexity typical of convention stop layers or end-point detection layers with respect to the polishing of silicon dioxide.

DETAILED DESCRIPTION OF THE PREFERRED EMBODIMENT(S)

Overview: Hydrophobic Modification of Silicon Dioxide

Figure 1A:
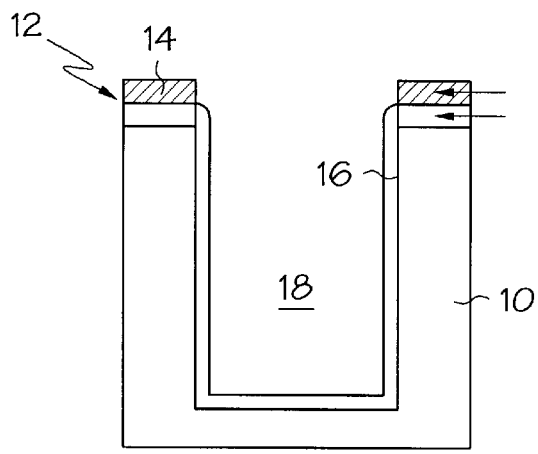
FIG. 1 provides a cross sectional side view (not to scale) of a trench capacitor in accordance with the present invention.

In accordance with the present invention, silicon dioxide is preferably modified to become hydrophobic (or more hydrophobic) by chemically bonding hydrocarbon radicals to the silicon dioxide surface or by dehydrogenating the silicon dioxide surface chemistry. Preferably, the silicon dioxide substrate is dried to a water content of less than about one weight percent by means of heated, dry air.

The silicon dioxide substrate is then contacted with a hydrolysable metal or metalloid compound containing O—R groups. Such a compound is an ester of the general formula $Me(O—R)_4$, wherein Me is an element from group IV of the periodic table, and each R is independently selected from $C_1$-$C_8$ alkyl radicals or an aryl radical or an alkyl-aryl radical. The resulting hydrophobic surface comprises far fewer silanol groups than conventional hydrophilic silicon dioxide. In place of the silanol groups are alkoxy or aryloxy groups which can render the surface practically incapable of being wetted with water at standard temperature. Preferably, the hydrophobic surface will have sufficient proton affinity to cause the surface to once again be wettable, after extended contact with superheated steam or boiling water.

The Hydrophobic Modifier

The preferred hydrophobic modifier has a general formula of $Me(O—R)_4$. "Me" is preferably an element of the IVth group of the periodic table. Titanium and silicon are preferred. "O" is oxygen. "R" is preferably an alkyl radical having 1–8 carbon atoms or an aryl radical, such as phenyl or naphthyl. Each of the four R radicals can be the same or different. For example, three of the R's can be (the same or different) alkyl radicals and the fourth R can be an aryl radical. A particularly preferred hydrophobic modifier is a tetraethyl-silicate or an oligomer thereof.

Ester compounds falling within the previously mentioned generic formula can be useful in accordance with the present invention. It is preferred that the ester compound be either gaseous or volatile at the surface temperature of the silicon dioxide in order to achieve even distribution along the silicon dioxide surface. However, less volatile ester compounds can also be used, such as those in liquid form. The liquid can be sprayed on the silicon dioxide surface by means well known in the art. Mixtures of the various ester compounds can also be used.

Hydrophobic Modifier+Silicon Dioxide

According to the methods of this invention, the hydrophobic modifier is contacted with the silicon dioxide surface of a semiconductor device or semiconductor device precursor. The silicon dioxide should have a water content of less than about 1% by weight. Preferably, the water content is about 0–0.2% by weight.

In a preferred embodiment of this invention, the hydrophobic modifier is applied to the silicon dioxide surface at a pressure of about 1,000 Torr to about $10^{-2}$ Torr, and at a temperature of about 20°–300° C. The hydrophobic modifier is contacted with the silicon dioxide preferably for a few minutes to about 24 hours. A preferred temperature is about 20°–200° C., while 20°–35° C. is particularly preferred.

In another preferred embodiment of this invention, the silicon dioxide surface is activated prior to contact with the hydrophobic modifier. Activation is accomplished by heating the silicon dioxide surface to about 700°–1,000° C. for less than about 60 seconds in a stream of inert gas. An inert gas is any which does not react with the silicon dioxide surface, such as nitrogen. Activation of the silicon dioxide surface in this manner generally reduces the time required to obtain a hydrophobic surface.

A silicon dioxide water content of more than about 1% by weight will inhibit or prevent hydrophobicity. Unwanted water content can be diminished by the activation step previously described.

In a preferred embodiment of this invention, a hydrophobic modifier is selected, which when contacted with the surface of a silicon dioxide substrate, produces a silicon dioxide surface entirely unwettable by water at ambient temperature within 30 minutes –3 hours. Alkoxy and aroxy silanes are particularly useful in the processes of the present invention.

In another embodiment of this invention, the silicon dioxide surface is contacted with anhydrous ammonia gas prior to or after contact with the hydrophobic modifier. The anhydrous ammonia general promotes the hydrophobicity reaction.

Alternatively, the silicon dioxide for the entire stop layer can have its chemistry modified by altering the deposition conditions. It can, for example, be modified by varying the stoichiometry of the source gases in a plasma enhanced chemical vapor deposition (PECVD) reactor so that the source gases are less oxide rich. This can produce a bulk film that is more hydrophobic than the original film.

Table 1 and Table 2 illustrate polishing rates as a function of oxygen radicals available in the PECVD gas stream. In both tables, as the number of potential oxygen radicals increases (from either $O_2$ or $N_2O$), the polishing rates increase. $N_2O$ provides fewer potential oxygen radicals than O2, and therefore Table 2 illustrates extremely low polishing rates due to extremely low amounts of potential oxygen radicals ($N_2O$ fractions of less than 0.5, and particularly $N_2O$ fractions less than 3). This data indicates that modifying the potential number of oxygen radicals in a PECVD gas stream can control the hydrophilicity (and hence, polishing rate) of a silicon dioxide substrate.

Figure 1B:
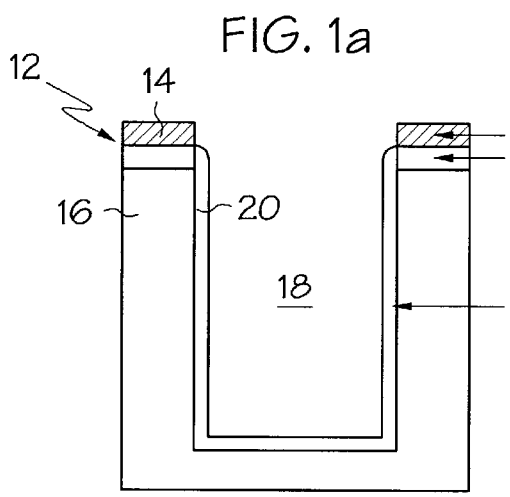

In one embodiment of the present invention as illustrated in FIG. 1a, a silicon substrate 10 is masked, so that only a portion of the silicon surface receives a layer 12 of unmodified silicon dioxide. The exposed surface 14 of silicon dioxide is then hydrophobically modified as described above. The portion of the silicon surface which is not covered by silicon dioxide is then etched, such as by a reactive ion emission, to provide one or more trenches or holes 18. Next as illustrated in FIG. 1b, a thin layer of silicon dioxide 20 is deposited on the sidewalls and the bottom of the trench(es), thereby annealing any ion damage caused by the initial etch and thereby providing a capacitor dielectric.

Figure 1C:
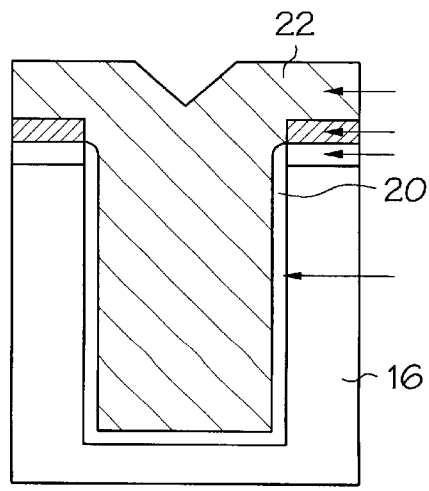
Figure 1D:
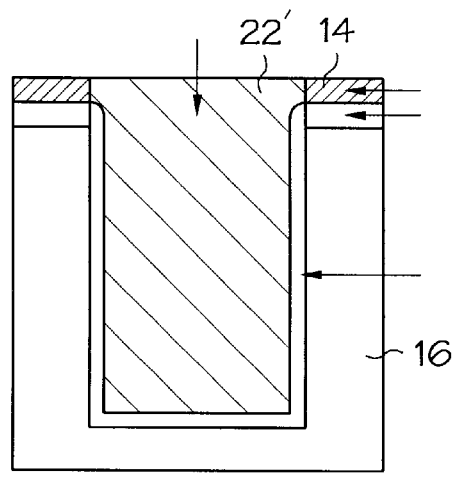

As illustrated in FIG. 1c, the trench(es) are then filled with doped polysilicon as shown at 22. Excess polysilicon will extend above the trench and on top of the modified silicon dioxide. As illustrated in FIG. 1d, polishing is then conducted to remove the excess polysilicon. The modified silicon dioxide 14 acts as a stop layer to thereby provide a smooth, polished surface and a flat, dimple free polysilicon plug 22'. The polysilicon plug can generally be used as a capacitor electrode. Such trench capacitors allow decreased feature sizes and increased storage capacity for memory products.

Figure 2A:
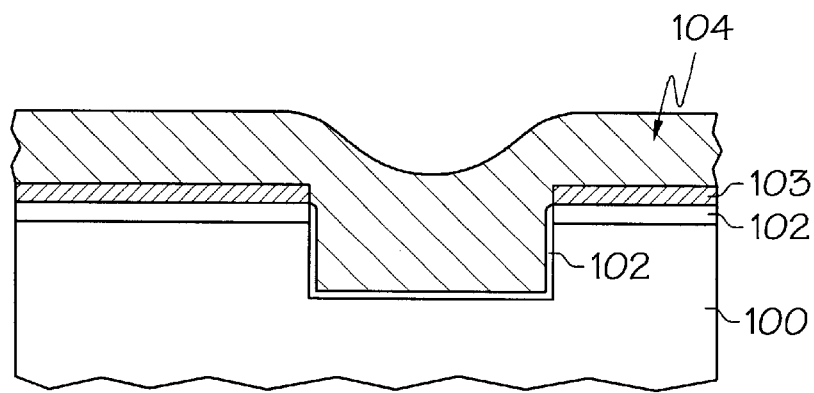
FIG. 2 provides a cross sectional view (not to scale) of a semiconductor device in accordance with the present invention, having shallow trench isolation with polysilicon fill.
Figure 2B:
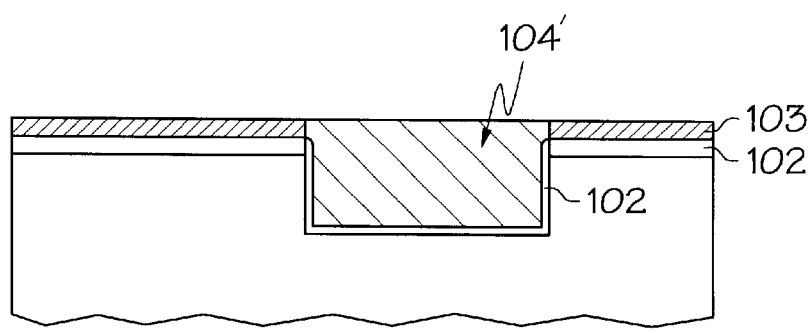

In an alternative embodiment of the present invention, as illustrated in FIG. 2a, a trench is etched into a silicon substrate 100 in the same manner as explained for the trench capacitor discussed in the previous paragraph. After a thin layer 102 of unmodified silicon dioxide is deposited to line the trench walls, the surface 103 of the silicon dioxide is modified in accordance with the present invention. Then polysilicon 104 is deposited into the trench and over the modified silicon dioxide layer 103. As illustrated in FIG. 2b, the excess polysilicon is polished off the modified silicon dioxide 103 and the polysilicon 104' is planarized over the trench. Such shallow trench isolation allows circuitry to be placed closer together and thereby allow space to be utilized more efficiently.

Figure 3:
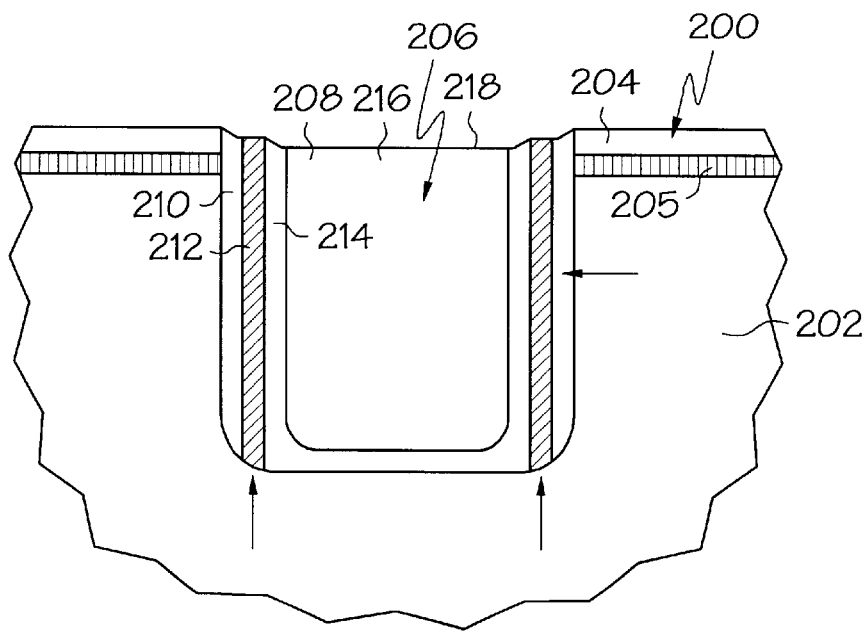
FIG. 3 provides a cross sectional view (not to scale) of a semiconductor device having trench isolation in accordance with the present invention.

In yet another alternative embodiment, as illustrated in FIG. 3, a silicon dioxide layer 200 is grown on a silicon wafer 202 using conventional silicon dioxide deposition technology. The surface 204 of the silicon dioxide layer is hydrophobically modified in accordance with the present invention. A conventional three step etch is used to make an isolated trench 206 through the modified silicon dioxide 204, the unmodified silicon dioxide 205 and into the silicon wafer surface. A thin unmodified silicon dioxide layer 210 is grown only upon the exposed silicon and etched away only at the bottom of the trench.

Polysilicon 212 is deposited in the trench and is etched away from the bottom, so that the polysilicon makes a sidewall that is grounded to the silicon wafer creating a field shield. An unmodified silicon dioxide layer 214 is layed down in the trench. A layer of densified silicon dioxide 216 is layered across the wafer filling in the trench and coating the modified silicon dioxide layer. The result is an uneven surface where the densified silicon dioxide is at one height covering the modified silicon dioxide and creates a valley over the trench. This densified silicon dioxide layer is so thick that even the lowest part of the valley is above the height of the modified silicone dioxide layer. Polishing is conducted to polish down the densified silicon dioxide from the modified silicon dioxide layer and thereby create a planar surface across the trench as shown at 218.

Figure 4A:
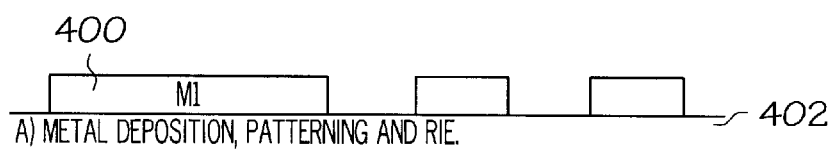
FIG. 4 provides a cross sectional view (not to scale) of a metal, insulator and stud formation of a semiconductor device in accordance with the present invention.
Figure 4B:
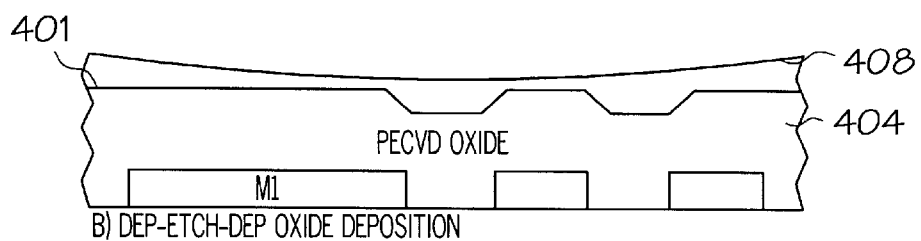
Figure 4C:
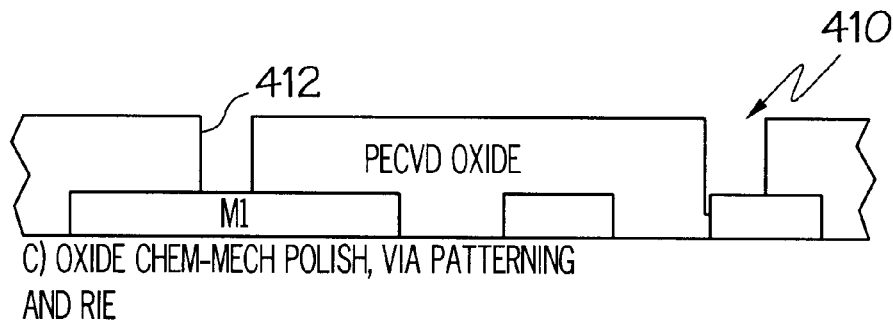
Figure 4D:
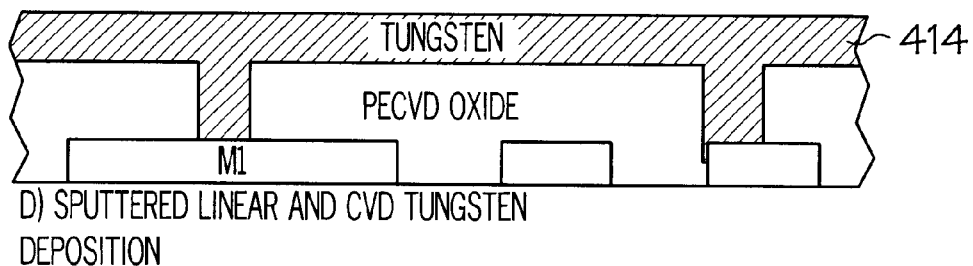

In yet another embodiment of the present invention, as illustrated in FIG. 4a, a metal film 400 is deposited onto a planarized substrate 402, photo-patterned and then defined by conventional reactive ion etching "RIE"). As shown in FIG. 4b, a plasma enhanced chemical vapor deposit of silcon dioxide 404 is then deposited over the metal pattern. The surface 406 of the silicon dioxide is hydrophobically modified in accordance with the present invention, and the modified silicon dioxide layer is covered by another (top) layer of unmodified silicon dioxide 408. This top layer is then planarized by polishing until at least a portion of the modified silicon dioxide is exposed, as illustrated at 410 in FIG. 4c. Next, photopatterning and RIE are employed to form nearly vertical vias 412 down to the underlying metal level. As shown in FIG. 4d, a sputtered metal liner and a blanket of metal 414 is deposited to fill and cover the vias.

Figure 4E:
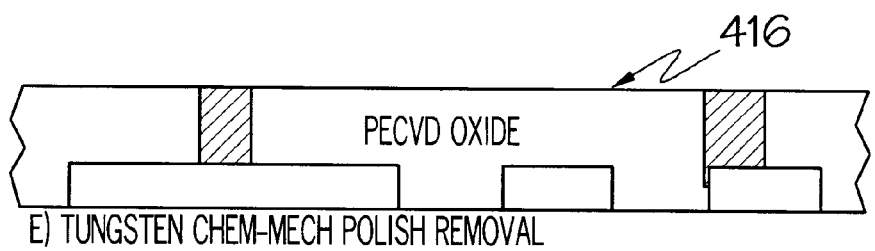

As shown in FIG. 4e, another planarization process is then conducted to provide a planarized surface 416 of metal (beneath the planarized metal surface, the vias remain filled with metal).

Figure 5:
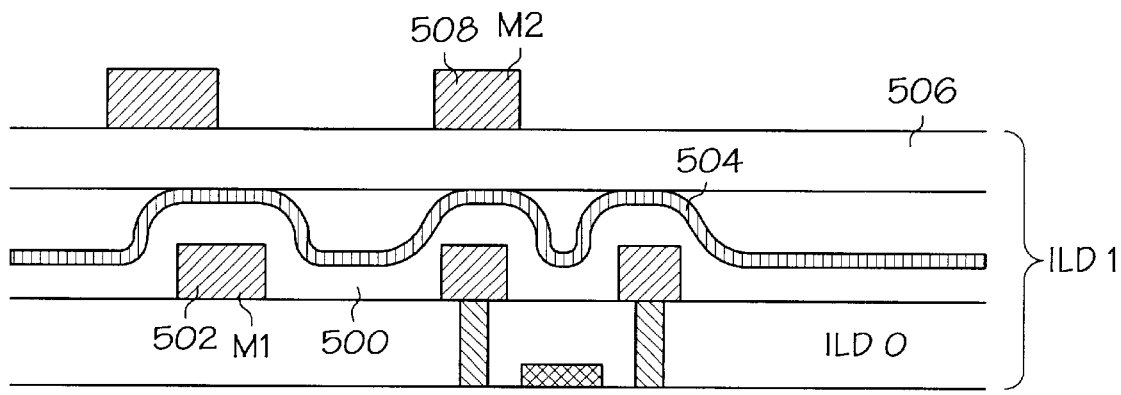
FIG. 5 provides a cross sectional view (not to scale) of an interlayer dielectric semiconductor device in accordance with the present invention.
Figure 6:
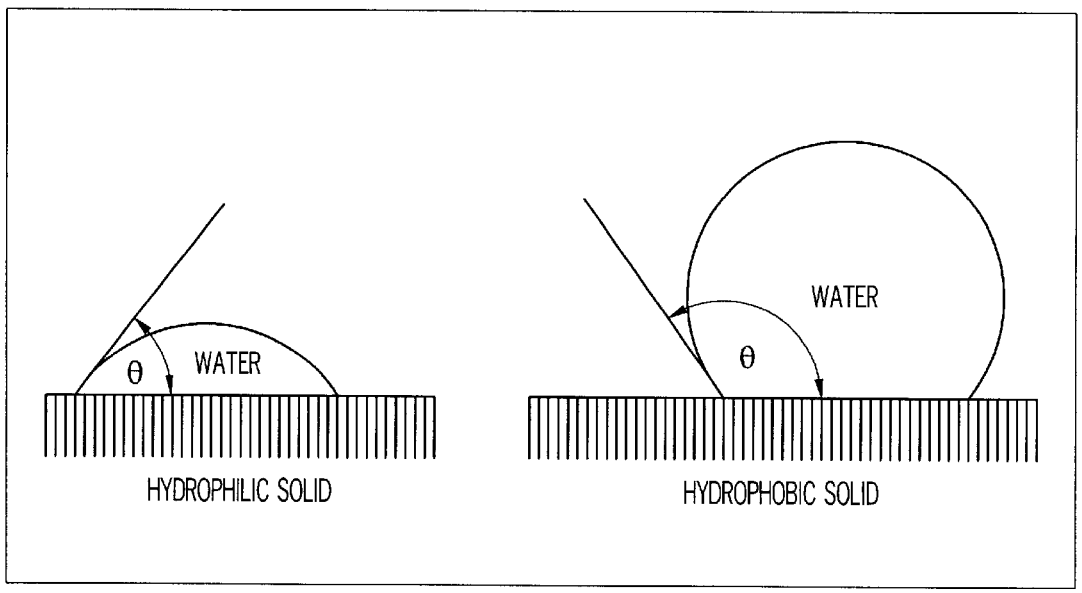
FIG. 6 illustrates the quantification of hydrophilicity or hydrophobicity (of a surface) by means of measuring a contact angle between a droplet of water and the surface.

As illustrated in FIG. 5, in yet another embodiment of the present invention, a layer of unmodified silicon dioxide 500 is deposited over an uneven metal surface 502. The surface 504 of the silicon dioxide is then hydrophobically modified and another (top) layer 506 of unmodified silicon dioxide is placed over the modified oxide. The top layer is then planarized until at least a portion of the modified oxide is exposed. A planarized layer of oxide is thereby provided over the metal layer, allowing another metal layer 508 to be placed above the first metal layer, whereby the two metal layers substantially parallel to one another are partially or wholly isolated from one another by the oxide layer.

The process of this invention will be more clearly understood by reference to the following conceptual examples:

EXAMPLE 1 a. a silicon dioxide substrate can be placed in a vessel and a vacuum can then be applied to the substrate. 50 g (of 10% by weight) tetra-n-butoxy silane can then be dripped in at room temperature within a few minutes. After the vacuum is neutralized with $N_2$, a dry $NH_3$ stream of gas is introduced into the product for 2–3 seconds. A sample is taken 30 minutes after conducting the ammonia treatment and the resulting silicon dioxide surface will be completely unwettable.

b. The experiment described in Example 1 (a) is carried out in the same manner, but without the treatment of $NH_3$.

A sample can be taken after 3 hours and is largely hydrophobic (but less hydrophobic than the sample of Example 1 (a)).

The hydrophilic character of the original silicon dioxide surface can be regained by contacting the hydrophobic surface with superheated steam, preferably for about 30 minutes or more.

EXAMPLE 2

Silicon dioxide can be sprayed with 50 g (of 10% by weight) tetraethoxy silane at ambient temperature for about 5 minutes. Then a dry stream of $NH_3$ gas cau be sprayed onto the surface for 2–3 seconds. 15 minutes after feeding in the ammonia, the product should no longer be wetted by water.

What is claimed is:

1. A method for manufacturing a semiconductor device or semiconductor device precursor, said method comprising the step of hydrophobically modifying a substrate surface of the semiconductor device or the semiconductor device precursor, said substrate comprising silicon dioxide, whereby the hydrophobic modification of said substrate reduces the polishing rate of said substrate by more than 15% relative to the polishing rate of said substrate before hydrophobic modification and whereby said substrate is hydrophobically modified by chemically bonding hydrocarbon radicals to at least a portion of the silicon dioxide or by dehydrogenating at least a portion of the silicon dioxide.

2. A method in accordance with claim 1, whereby at least a portion of the silicon dioxide is hydrophobically modified by applying hydrophobic modifier to the silicon dioxide, said modifier having a general formula of $Me(O-R)_4$, where Me is a metal, "O" is oxygen, "R" is an alkyl radical having 1–8 carbon atoms or all aryl radical, wherein each of the four R radicals can be the same or different.

3. A method in accordance with claim 1, whereby the semiconductor device comprises a trench capacitor, an isolated trench, a combination comprising a metal, an insulator and a stud, or an interlayer dielectric.

4. A method in accordance with claim 1, wherein said substrate is pre-treated with an anhydrous inert gas.

5. A method in accordance with claim 1, whereby the hydrophobic modification of the substrate reduces the polishing rate of the substrate by more than 25% relative to the polishing rate of the substrate before hydrophobic modification.

6. A method in accordance with claim 5, whereby the hydrophobic modification of the substrate reduces the polishing rate of the substrate by more than 50% relative to the polishing rate of the substrate before hydrophobic modification.

* * * * *